United States Patent [19]

Fichtenbaum

[11] 4,186,338
[45] Jan. 29, 1980

[54] PHASE CHANGE DETECTION METHOD OF AND APPARATUS FOR CURRENT-TRACING THE LOCATION OF FAULTS ON PRINTED CIRCUIT BOARDS AND SIMILAR SYSTEMS

[75] Inventor: Matthew L. Fichtenbaum, Chelmsford, Mass.

[73] Assignee: GenRad, Inc., Concord, Mass.

[21] Appl. No.: 751,103

[22] Filed: Dec. 16, 1976

[51] Int. Cl.² ........................................... G01R 31/08
[52] U.S. Cl. .................................. 324/52; 324/73 PC
[58] Field of Search ...................... 324/51, 52, 66, 67, 324/73 PC, 3, 45, 233; 179/175.3 A, 175.3 F; 318/576; 219/124.22, 124.34

[56] References Cited

U.S. PATENT DOCUMENTS

| | | | |
|---|---|---|---|
| 2,744,232 | 5/1956 | Shawhan et al. | 324/233 X |
| 2,921,179 | 1/1960 | Anderson | 318/576 X |
| 2,946,939 | 7/1960 | Lind | 318/576 X |
| 3,076,931 | 2/1963 | Jasper | 324/67 X |
| 3,201,562 | 8/1965 | Anderson | 324/67 UX |
| 3,303,400 | 2/1967 | Allison | 324/52 UX |
| 3,344,347 | 9/1967 | Stevens | 324/45 |
| 3,705,956 | 12/1972 | Dertouzos | 178/18 |
| 3,725,779 | 4/1973 | Mauer | 324/51 |
| 3,860,866 | 1/1975 | Dornberger | 324/52 |
| 3,889,179 | 6/1975 | Cutler | 324/67 X |
| 3,924,179 | 12/1975 | Dozier | 324/67 X |
| 3,988,663 | 10/1976 | Slough et al. | 324/3 |
| 3,992,663 | 11/1976 | Seddick | 324/52 |
| 4,074,188 | 2/1978 | Boatman et al. | 324/52 |

FOREIGN PATENT DOCUMENTS

| | | | |
|---|---|---|---|
| 219493 | 4/1957 | Australia | 324/52 |
| 2050705 | 4/1971 | Fed. Rep. of Germany | 324/52 |

*Primary Examiner*—Gerald R. Strecker
*Attorney, Agent, or Firm*—Rines and Rines, Shapiro and Shapiro

[57] ABSTRACT

This disclosure is concerned with novel current-tracing of short circuits in printed circuit boards and similar systems by novel test excitation of the conductors with tracing of the phase polarities of the fields generated therein.

4 Claims, 5 Drawing Figures

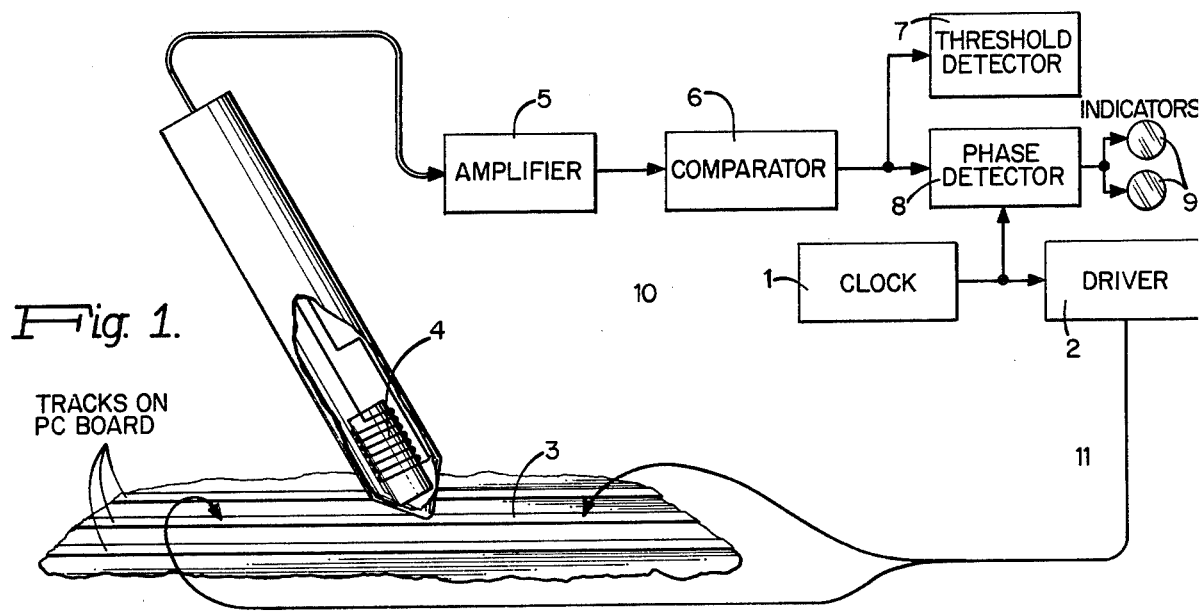
Fig. 1.
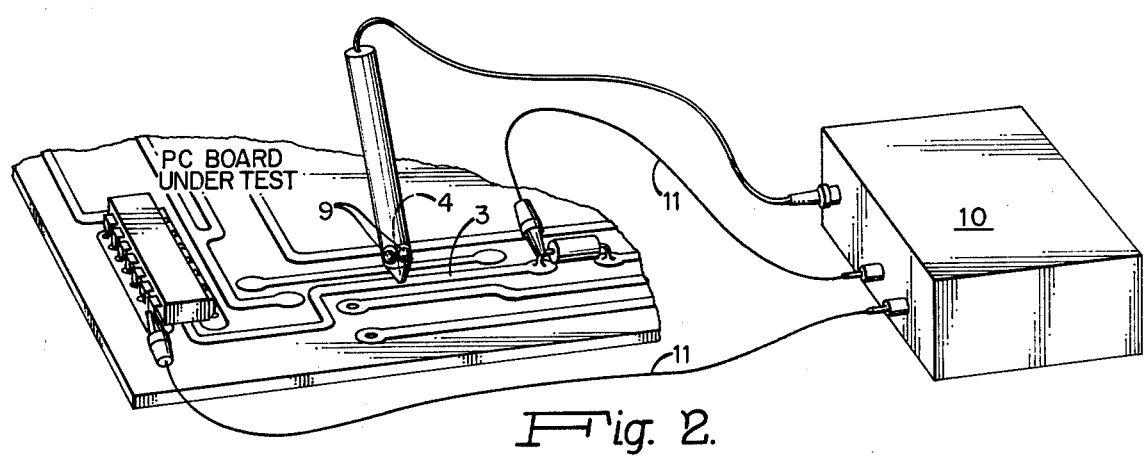
Fig. 2.
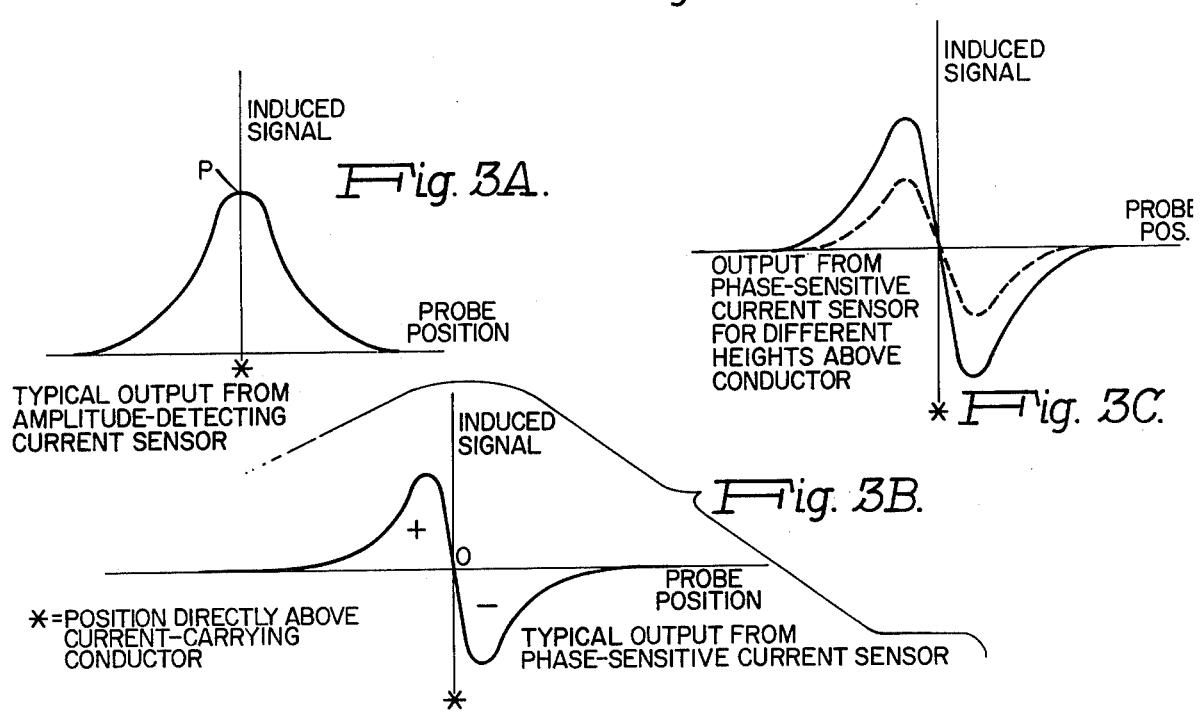
Fig. 3A.
Fig. 3B.
Fig. 3C.

PHASE CHANGE DETECTION METHOD OF AND APPARATUS FOR CURRENT-TRACING THE LOCATION OF FAULTS ON PRINTED CIRCUIT BOARDS AND SIMILAR SYSTEMS

The present invention relates to methods of and apparatus for current-tracing the location of faults in conductor tracks on printed circuit boards and similar systems, being more particularly concerned with detecting the location of short circuits and the like therein.

There have been previous systems evolved for enabling the finding of short circuits and the like in printed circuit board and similar systems, where conductors are provided on the board at very close separations and where it is often difficult to locate the point of the fault. Included in such prior proposals are current tracer signal-amplitude measuring probes as described, for example, in the Hewlett-Packard bulletin entitled "Current Tracer, Model 547A" November 1975; the Testline of Titusville, Fla., "Shortstop" probe apparatus; and related systems as disclosed in U.S. Pat. Nos. 1,158,086; 2,226,021; 2,249,166; 2,586,781; 2,698,921; 2,769,868; 2,974,278; 3,753,089; 3,831,086; and 3,882,287. Devices such as the first-named current tracers rely on a movable coil in the form of a probe, picking up the voltage induced in such a coil by current flowing in a particular track on the device being examined. The intent in the use of such a device is to position the probe coil so that the greatest possible signal amplitude is induced in that coil. In such case, the coil is in closest possible proximity to the track of interest, i.e. the track carrying the current. By observing where the maximum signal is picked up as the probe is moved, one can, in the ideal, trace the path of the current.

Difficulties with such amplitude-measuring techniques and the limitations thereof are as follows. One is looking with such a probe for a peak, a maximum in the induced signal that will indicate that the probe coil is closest to the track under test, and such peak is not a particularly sharp one. In fact, within close proximity to the track carrying the current, the signal amplitude falls off relatively slowly as the probe is moved away. The distance between the probe coil and the track under test in any direction, moreover, is of prime importance; and if the track passes under a component or through some other constricted area where the probe cannot directly reach, such constraints impose even further amplitude reduction. It can thus be less than straightforward for the operator of such an apparatus to discriminate, when an amplitude drops, whether this is because one is getting away physically from the direction the track is taking, or whether one has moved the probe, for example, further above the board to get over some obstruction, requiring a fair degree of interpretation in the results from such a device.

In addition, such devices generally operate in connection with the fields produced by the actual operating currents and voltages in the circuit board. Among the limitations of such a concept are that it is hard to ascertain that the particular track of interest is the only one in the immediate area that is carrying current in such an operating board. The chances are that there is more than one signal occuring at the same time, and, in simply looking for a signal in a track, the operator can lose the path of the track of interest. This can be overcome at least in part by supplying a particular signal to a board that is otherwise inactive, and only to the track of interest. The current-tracing probe may also be used with a separate pulse source probe such that current pulses inserted by the current-pulse probe may be followed with the current tracer.

Underlying the present invention, however, is a novel philosophy of operation in connection with phase polarities of fields generated with a rather critically designed excitation concept for placing a desired test current in the portions of the board conductors to be examined. This is not to say that probes have not heretofore been otherwise used with phase detectors as, for example, in U.S. Pat. No. 3,860,866; or that directional pick-up coils have not been otherwise used as, for example, in U.S. Pat. No. 3,889,179. But these do not involve the type of phase polarity measurement or particular excitation current concepts that have been found to produce the highly improved and novel results of the invention. The use of a pick-up coil broadly responsive to phase, of course, is decades old; a more recent application being as the stylus of a graphic-input tablet using phase detection as part of a scheme by which the X and Y coordinates of the pen of the stylus are determined and presented as digital information, as in U.S. Pat. No. 3,705,956. But that is unrelated to the particular usages and connections in the different problem underlying the present invention.

The magnetic field around a conductor track carrying current changes its perceived direction as one passes over the conductor. This assumes a conductor substantially in a plane, so that a point fairly small distance to one side of a current-carrying conductor will perceive a field opposite in direction to that perceived by a point a small distance on the other side of the conductor. By measuring the direction of the field and locating the position at which the measured field appears to change direction, a very sharp and precise indication as to the location of the conductor is attainable. In the event that the signal used to excite the conductor, i.e. the signal flowing in the conductor track, is an alternating current signal, then the direction of the measured field is equivalent to the phase picked up by the measuring or probe coil relative to the phase of the current flowing in that track; and by driving the track with a signal of known phase and comparing the signal measured by the probe coil to that signal of known phase, a very precise indication of the physical position of the current-carrying conductor may be obtained as the physical point at which the perceived phase changes is noted. The fault may then be traced along the conductor.

Added advantages of using phase as the parameter of interest are increased discrimination of location, and relative insensitivity, within broader ranges, to the position of the coil above the circuit board. While in the prior art amplitude-sensing current tracers the distance between the probe and the current-carrying conductor directly affects the amplitude of the measured signal, the measurement of the phase of the signal in accordance with the invention remains unaffected by sheer distance between the conductor and the probe. This is not to say that the probe can be arbitrarily far away, because as the distance increases, the probe becomes more sensitive to signals generated by other conductors carrying current, including the leads bringing the excitation signal to the track under test. But within a reasonable range of distances, comparable to, say, several times the size of the probe coil, the measured phase, and hence the validity of the information as to where the current-carrying conductor is, remains unchanged with variations in distance between probe and conductor; i.e., the distance of the probe from the conductor.

An object of the invention, accordingly, is to provide a new and improved method of and apparatus for current tracing circuits, and more particularly locating short circuits or the like in printed circuit boards and similar apparatus, that obviate the above-described disadvantages and limitations of prior art amplitude-measuring and other approaches.

A further object is to provide a novel current-tracing apparatus operating upon phase measurement and of more general applicability, as well.

Other and further objects will be explained hereinafter and are more fully delineated in the appended claims.

In summary, from one of its view points, the invention embraces a method of current-tracing the location of faults such as short circuits on printed circuit boards and the like, that comprises, applying an a.c. test excitation signal along a predetermined conductive track among other closely disposed tracks on a printed circuit board to generate a magnetic field about the predetermined track; probing back and forth on either side of the predetermined track in the proximity of and along the same to pick up said field and produce voltages induced therefrom; indicating the point of phase change of said voltages as the probing crosses the track to pin point the track; and tracing the same to find the fault location.

The invention will now be described with reference to the accompanying drawings, FIG. 1 of which is a combined schematic and block circuit diagram illustrating a preferred embodiment of the invention operating in accordance with the method underlying the same;

FIG. 2 is a similar view illustrating the application of the system of FIG. 1 to an actual short-circuit-detection usage with a printed circuit board; and FIGS. 3A, 3B, and 3C are waveform diagrams illustrating, respectively, the operation of the prior-art amplitude-detecting technique (FIG. 3A), the polarity operation of the phase system of the invention (FIG. 3B), and the relative insensitivity of the same to the position above the board (FIG. 3C).

Referring to FIG. 1, there is shown a functional block diagram of a system 10 embodying the approach underlying the invention. A clock 1 generates the basic electrical oscillation excitation signal that is applied as a current through a driver 2 via path 11 to the tracks 3 under test, and also the reference signal for determining the phase of the signal from the probe coil 4. The pickup or probe coil 4 is positioned in the vicinity of the tracks 3 under examination and receives an a.c. voltage induced in it by the magnetic field of the tracks. This voltage is applied to an amplifier 5, preferably an amplifier tuned to said oscillations to improve sensitivity without picking up extraneous signals. From the amplifier 5, it is applied to a comparator 6 which effectively changes the amplified a.c. signal from the probe to a logic signal. The comparator output is applied to a threshold detector 7 the purpose of which is to determine that the probe 4 is actually in proximity to the tracks 3 under examination and to suppress extraneous indications to the operator if insufficient signal is being received. The comparator output is also applied to a phase detector 8 which receives, as its other input, the original clock signal from 1. The phase detector 8 produces outputs that drive one of two indicators 9, such as visual indicators; one being energized if the measured signal is in phase with the clock signal, and the other, if the measured signal is out of phase.

The probe coil 4 is wound in such a manner that its axis is substantially perpendicular to the plane containing the track conductors 3 when the length of the elongated probe housing that carries the coil 4 is substantially perpendicular to that plane. The line defined by this axis, when extended down to the surface containing the conductor, is the line that effectively denotes the position of that conductor.

The comparator 6 is adjusted to compare the instantaneous value of the a.c. signal output of the amplifier 5 against a voltage approximately at its midpoint, such that when the instantaneous value of the output from the amplifier is greater than this threshold, a digital logic "one" is produced or converted by the comparator. When the amplifier output is less, a logic "zero" is produced. The result is that the comparator 6 produces a square wave whose transition points correspond to the zero crossings of the amplifier output about its steady-state level. The comparator 6, for example, may be of the integrated circuit zero-crossing detector type as described in Signetics Corp. Bulletin "Linear Integrated Circuit LM 311"; the threshold detector 7 of similar comparator chip type and an R-C low pass filter; and the phase detector 8, of the sampling type of the assignee's GR 1683 bridge and GR 1161 frequency synthesizer implemented with a digital flip-flop. Other well known components may also clearly be used.

The importance of magnitude of the excitation signal resides in the fact that the greater the excitation signal, the larger the magnetic field around the track conductor of interest, and hence the greater the voltage induced in the pickup coil 4. The actual value chosen depends on several details of implementation, principally the signal required from the pickup coil 4 to be readily discernible in the presence of noise or uncertainties that might arise in the amplifier circuitry. It has been found that an a.c. signal level of the order of 10 milliamperes is sufficiently large to give good signal pickup with adequate noise margin, yet without producing current levels that can either damage a device under test or perhaps give false indications by providing sufficiently high levels to enable the development of erroneous paths. A clock oscillation frequency in the neighborhood of 600 kHz has proven satisfactory. This is determined primarily by the tuned components in the received signal chain. For the purposes of signal detection and noise exclusion, the tuned amplifier 5 may function with the coil in the probe 4 made resonant, as with suitable capacitance, in the neighborhood of, for example, said 600 kHz.

Turning, now, to FIG. 2, the system of FIG. 1 involving the probe housing with its pickup coil 4 and the associated circuit system 10, are illustrated as applied to a typical use in search for short circuits in a printed circuit board. The housing or box containing the electronic circuitry 10 drives the tracks 3 under test through two signal leads 11 which carry the excitation signal; one lead being attached to one conductor, and the other lead to the other conductor, where the two conductors are the pair of tracks 3 between which there is an unwanted short circuit such that they effectively appear to be one conductor and so that the signal may follow a conductive path from one signal lead to the other signal lead via the pair of tracks and short circuit. The object, of course, is to find the location of the short so that the unwanted part of the path can be located and removed.

The housing of the probe 4 is illustrated in FIG. 2 as also containing the indicator lamps 9, and is shown located above a segment of the track of interest. One of the two indicators 9 is schematically illustrated as illuminated. In operation, the operator would hold the probe in his or her hand and move it in the proximity of the track until one indicator went out and the other one came on. At that point, the probe would be located directly over the track carrying the current. Referring to FIG. 3B, plotting the magnitude of the received or induced signal in the probe coil 4 as a function of the probe position relative to the track 3 carrying the current, it can be seen that as the probe approaches the track from a fair distance away, the magnitude of the signal increases in one direction (say positive or +) until the probe is extremely close to the track; that is, extremely close in terms of within a fraction of the diameter of the probe coil 4. At that point, the amplitude of the received signal falls off very sharply, and in a very short incremental distance, goes from a peak of positive phase, through zero to a peak of the negative (−) phase. The sensitivity of the signal-detect circuitry is such that one indicator 9 will remain lit until the positive received signal is almost zero; and the other indicator 9 will illuminate when the negative signal reaches above a certain, very small threshold. As a result, there is an extremely small range of uncertainty about the point directly above the track in which neither indicator is lit, and outside of this position of uncertainty there is a very clear indication—one indicator or the other being illuminated—that the probe is to one side or the other of the current-carrying conductor.

This is to be contrasted with the previously mentioned amplitude-sensing, the operation of which is illustrated in FIG. 3A in which the signal strength increases much as it does in the phase scheme, when the probe approaches from a great distance; but, as the probe reaches the near vicinity of the track of interest, the signal continues to increase to a peak P directly above the track. Because, again, the distances are comparable to the dimensions of the probe coil, this peak tends not to be particularly sharp; it requires fair discrimination to determine it directly; and, as mentioned, is a function of the distance between the probe coil and the track. There is potential for error here as a change in this distance may readily be caused by intentional motion of the probe, operator uncertainty, or the need to avoid some component of the board. This can be contrasted, as in FIG. 3C, with the operation of the phase scheme of FIG. 3B. The two traces in FIG. 3C show the signal induced in the probe coil when the probe coil is directly above the plane carrying the conductor (solid line) or in some distance away (dotted line). The received signal where the coil is some distance away is just smaller. The behavior in terms of changing sign as the probe crosses the conductor remains unchanged such that with certain minimum sensitivity in the signal processing path, the circuit can function properly even with a reduced signal.

Typical track spacing on printed circuit boards in use is on the order of 20 to 40 thousandths of an inch. The spacing resolvable by the short-detecting probe depends, of course, on the dimensions of the probe coil; but with the probe coil 4 of the present invention, which may be approximately one tenth of an inch in diameter (with a sensitive region of this size), there is no difficulty in resolving which one of several conductors spaced 20 to 30 thousandths apart in carrying the current. This may be improved further by making the coil smaller in diameter, but at the cost of reducing the signal induced in it.

The short-detecting probe using phase in accordance with the invention thus offers primarily two advantages. There is a very clear indication when the probe crosses the track of interest, and there is an indication as to which side the probe is on, making it substantially impossible that a particular crossing can go unnoticed. It is thus a very clear, direct operation requiring little or no interpretation, to move the probe essentially in a zigzag path, back and forth, along a path just to one side and the other of the conductor of interest, so as to verify at any point the particular conductor under observation by the phase changes and accordingly to trace out the path of the signal current until the unwanted section of path is found. In techniques that use amplitude, on the other hand, the location of the peak is subject to interpretation because it is not a sharp peak and because it depends on factors such as height of the probe coil above the board. The operator must be careful to ensure that a peak does not go unnoticed such that the probe is actually on the wrong side of the current-carrying conductor from the side that operator has in mind. Because the indications of the short-detecting probe of the invention are relatively simple, moreover, the two lights are easily placed directly in the probe, as indicated in the implementation of FIG. 2, resulting in the operator not having to lift his eyes from the direct probe position during measurement. This is as contrasted with prior art amplitude signal indication by a meter or the like wherein the operator needs to look at things in two places; or in connection with techniques as used by Hewlett Packard, supra, the operator must effectively use a threshold detection adjustment continually subjectively to determine what the measured field strength is.

While the invention has been described in connection with its important application to the detection of short circuits on printed circuit boards and the like, it appears that the method underlying the same and this type of apparatus may also have other applications such as, for example, to any situation which requires that the path of a particular conductor be determined. The technique is applicable not only to paths on a printed circuit board but to conductors on a cable or in a bus system or other aggregation of electrical conductors. It has also been successfully used to find the location of short circuits within a cable, and can be extended to the location of other conducting objects which are not primarily intended as electrical conductors, such as determination of the presence of a metal structural member or a water pipe that is buried so as not to be visible. Further modifications will also suggest themselves to those skilled in this art, including other indicating means or automatic mechanical positioning under computer control; such being considered to fall within the spirit and scope on the invention as defined in the appended claims.

What is claimed is:

1. A method of current-tracing the location of a short circuit fault between a pair of conductive tracks among closely disposed tracks on a printed circuit board, that comprises, connecting a pair of signal leads to said pair of tracks, respectively, applying to said pair of tracks, via said signal leads, an a.c. test excitation signal that follows a conductive path from one signal lead to the other signal lead via said pair of tracks and said short circuit fault and that generates a magnetic field about the path; deliberately moving a probe held in the hand of a human operator back and forth across and along one of said pair of tracks in the proximity of said path in a zig-zag manner to pick up said field and produce voltages induced therefrom; repetitively indicating to said operator the point of phase change of said voltages as the probe crosses said one track to pin point said one track; and continuing the movement of the probe to trace the path of said signal along said one track to the location of said short circuit fault.

2. A method as claimed in claim 1 and in which the sensitive pick-up region is adjusted to be of the order of approximately one tenth inch and the signal strength of said excitation signal is adjusted to a level of the order of approximately 10 milliamperes.

3. Apparatus for current-tracing the location of a short circuit fault between a pair of conductive tracks among closely disposed tracks on a printed circuit board, having, in combination, a pair of signal leads adapted to be connected to said pair of tracks, respectively, means for applying to said pair of tracks, via said signal leads, an a.c. test excitation signal that follows a conductive path from one signal lead to the other signal lead via said pair of tracks and said short circuit fault and that generates a magnetic field about the path; hand-held magnetic field probe means having an elongated housing carrying a pickup coil and adapted to be deliberately moved by the hand of a human operator along and back and forth across one of said pair of tracks in the proximity of said path in a zig-zag manner to induce voltages in said pickup coil from said field, said pickup coil being of the order of approximately one-tenth of an inch or less in diameter and being wound about an axis that is substantially perpendicular to the plane of said tracks when the length of said housing is substantially perpendicular to said plane; means for detecting the phase of the induced voltages and the point of reversal change thereof as the probe means crosses said one track; and means for repetitively indicating such point of change to said operator as the probe means is moved along said one track, said indicating means comprising a pair of lights carried by the housing of said probe means and energized alternately as the probe means crosses to opposite sides of said one track.

4. Apparatus as claimed in claim 3 and in which said phase detecting means comprises comparator means connected to receive said voltages induced in said coil; threshold detector means cooperative with said comparator means for generating therefrom a square wave the transition points of which correspond to zero crossings of the induced voltage about a steady-state level; and a phase detector connected to receive the generated comparator means square wave and reference phase information from the said a.c. test excitation signal and correspondingly to signal the indicating means.

* * * * *